United States Patent
Wörz et al.

(10) Patent No.: US 6,703,651 B2
(45) Date of Patent: Mar. 9, 2004

(54) ELECTRONIC DEVICE HAVING STACKED MODULES AND METHOD FOR PRODUCING IT

(75) Inventors: Andreas Wörz, Kelheim (DE); Ingo Wennemuth, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/948,261

(22) Filed: Sep. 6, 2001

(65) Prior Publication Data

US 2002/0034069 A1 Mar. 21, 2002

(30) Foreign Application Priority Data

Sep. 6, 2000 (DE) .......................................... 100 44 148

(51) Int. Cl.[7] .............................................. H01L 23/538
(52) U.S. Cl. ....................... 257/209; 257/529; 257/665; 257/686; 257/723; 361/778; 361/803; 438/128; 438/130; 438/132
(58) Field of Search ................................ 361/760, 761, 361/764, 778, 783, 784, 790, 791, 803, 805; 365/51, 52, 63; 257/203, 208, 209, 529, 665, 666, 668, 676, 686, 723, 777; 438/109, 111, 121, 123, 128, 130, 132

(56) References Cited

U.S. PATENT DOCUMENTS

| | | | | |
|---|---|---|---|---|
| 4,982,265 A | * | 1/1991 | Watanabe et al. | 174/52.4 |
| 4,996,583 A | * | 2/1991 | Hatada | 257/668 |
| 5,198,888 A | * | 3/1993 | Sugano et al. | 257/685 |
| 5,266,834 A | * | 11/1993 | Nishi et al. | 257/706 |
| 5,343,075 A | * | 8/1994 | Nishino | 257/686 |
| 5,434,745 A | * | 7/1995 | Shokrgozar et al. | 174/52.4 |
| 5,744,827 A | * | 4/1998 | Jeong et al. | 257/673 |
| 5,760,471 A | * | 6/1998 | Fujisawa et al. | 257/666 |
| 5,847,985 A | * | 12/1998 | Mitani et al. | 361/686 |
| 5,973,396 A | * | 10/1999 | Farnworth | 257/698 |
| 5,995,379 A |   | 11/1999 | Kyougoku et al. | 361/803 |
| 6,239,495 B1 | * | 5/2001 | Sakui et al. | 257/685 |
| 6,297,074 B1 | * | 10/2001 | Miyano et al. | 438/109 |
| 6,340,845 B1 | * | 1/2002 | Oda | 257/686 |
| 6,381,141 B2 | * | 4/2002 | Corisis et al. | 257/686 |
| 6,392,292 B1 | * | 5/2002 | Morishita | 257/686 |

\* cited by examiner

Primary Examiner—John B. Vigushin
(74) Attorney, Agent, or Firm—Laurence A. Greenberg; Werner H. Stemer; Ralph E. Locher

(57) ABSTRACT

An electronic device having stacked modules and method for producing it are described. Each module has a chip. Each chip is mounted on a stack intermediate plane. The stack intermediate planes of a stack have identical layouts, while chip select circuits which can be set irreversibly via contact areas are disposed on the chips, which chip select circuits enable an irreversible assignment of the contact areas to the stack intermediate planes.

27 Claims, 2 Drawing Sheets

ELECTRONIC DEVICE HAVING STACKED MODULES AND METHOD FOR PRODUCING IT

BACKGROUND OF THE INVENTION

Field of the Invention

The invention relates to an electronic device having stacked modules and to a method for producing it. Each of the modules has a chip mounted on a stack intermediate plane formed by a lead frame.

In order to ensure access to the individual chips, each stack intermediate plane has a chip select circuit that can be set. With the chip select circuit, which requires a different layout for each stack intermediate plane, each individual chip of the stacked modules of the electronic device can be accessed by addressing. Such stacked devices have the disadvantage that a dedicated layout has to be configured and produced for each stack intermediate plane. As a result, not only is the risk of mixing up the stack intermediate planes during the assembly or stacking of the modules to form an electronic device correspondingly increased, but the considerable complexity for different constructions of the different lead structures on the stack intermediate planes also requires an increased expenditure during the production of an electronic device having stacked modules.

SUMMARY OF THE INVENTION

It is accordingly an object of the invention to provide an electronic device having stacked modules and a method for producing it that overcomes the above-mentioned disadvantages of the prior art devices of this general type, in which the complexity of the configuration of the stack intermediate planes is considerably reduced and the addressing of the individual modules can be ensured in a simple manner.

With the foregoing and other objects in view there is provided, in accordance with the invention, an electronic device. The electronic device contains stacked modules having stack intermediate planes and chips mounted on the stack intermediate planes. The stack intermediate planes of the stacked modules each have an identical layout. Contact areas are disposed on the chips. Chip select circuits are also disposed on the chips and are able to be set irreversibly through the contact areas. The chip select circuits enable an irreversible assignment of the contact areas to the stack intermediate planes.

According to the invention, the object is achieved by an electronic device having stacked modules. Each of the modules has the chip mounted on the stack intermediate plane, and the stack intermediate planes of a stack have an identical layout. The chip select circuits which can be set irreversibly via contact areas are disposed on the chips, which chip select circuits enable an irreversible assignment of the contact areas to the stack intermediate planes.

This solution has the advantage that the chip select circuit can be minimized and takes up a significantly smaller space requirement than the chip select circuit that is disposed on a stack intermediate plane.

A further advantage is the identical embodiment of all the stack intermediate planes, which is beneficial for mass production, on the one hand, and reduces the costs for the stack intermediate planes, on the other hand.

In one embodiment, the chip select circuit—disposed on the chip—of the present invention has a number of interrupter circuits. The number of interrupter circuits corresponds at least to the number of stack intermediate planes. This has the advantage that the chip addressing can already be performed irreversibly at the chip level by tripping the interrupter circuits, with the result that different addressing circuits on the stack intermediate planes can be obviated. Furthermore, the chip select circuit on the chip has the advantage that the addressing does not have to be performed from the outset, rather the chip addressing or the chip selection can be performed at a suitable point in the production method for the electronic device. In this case, the suitable point depends on the interrupter circuit technology and the most cost-effective point in time for irreversible addressing or irreversible assignment of the contact areas to the stack intermediate planes of the stacked modules of an electronic device.

In a preferred embodiment of the invention, each interrupter circuit is provided with an input line, which is connected to an input contact area, and with an output line, which is connected to an output contact area. Each of the interrupter circuits can be tripped individually via the input contact line or the output contact line, with the result that only one interrupter circuit—determining the stack intermediate plane—on an addressed chip in the chip select circuit is not tripped.

In a further embodiment of the invention, the interrupter circuits have a common output contact area and separate input contact areas. Such a configuration and interconnection of the interrupter circuits reduces the area outlay for the chip select circuit on the chip and simultaneously ensures that each individual interrupter circuit can be driven.

A further embodiment of the invention provides for the input contact areas of the interrupter circuits to be connected via bonded wires to input pads on the stack intermediate planes. This embodiment has the advantage that the tripping of the interrupter circuits does not have to be tripped directly on the chip via the input contact areas, rather, for this purpose, it is possible to use input pads on the identical stack intermediate planes, to which access is facilitated by virtue of the larger input pads relative to the input contact areas.

In a further embodiment of the invention, the input contact areas on the stack intermediate planes are connected to input contact pins which connect the stacked modules. The input contact pins are consequently provided on the stacked modules after the modules have been stacked one above the other, and thus reduce the multiplicity of contact areas and contact pads to a minimum number of input contact pins via which a defined access to the individual modules in the stack then becomes possible. Consequently, the input contact pins are also at the same time the addressing contacts via which access becomes possible to the different stack intermediate planes and chips of the stacked modules from an external circuit for example on a printed circuit board or a flexible lead bus.

In a further embodiment of the invention, the common output contact area of the chip select circuit is in each case connected via a bonded wire to a common output pad on the stack intermediate plane. Since, in this embodiment of the invention, all the interrupter circuits of a chip have only one output contact area, it is therefore necessary also to provide only one output pad on each stack intermediate plane. The outlay for the stack intermediate planes is reduced from individually adapted different addressing circuits on each a stack intermediate plane to now uniform input pads and a common output pad on each stack intermediate plane.

In a further preferred embodiment of the invention, the input pads of the stack intermediate planes are led via through contacts to input contact pins on the base area of the electronic device with the stacked modules. This embodiment has the advantage that the entire base area of the electronic device can be provided with contact pins, thereby enabling a high number of addressing pins and also other signal and power connection pins for an electronic device having the stacked modules.

In a further embodiment of the invention, the input pads of the stack intermediate planes are disposed in the edge region of each stack intermediate plane and are connected via input contact pins on the side areas of the electronic device. For this purpose, the edge region of a lead frame on which the stack intermediate plane is situated is metallized at the locations that are intended to be connected to the input contact pins.

A method for producing an electronic device having stacked modules with irreversible definition and assignment of input contact pins as address contacts has the following method steps. A chip select circuit having a number of interrupter circuits is disposed on the chip. The chip select circuit has separate input contact areas and a common output contact area. The chip is applied on a lead frame having a stack intermediate plane, which has a number of separate input pads and a common output pad. The input contact areas are connected to the input pads and the output contact areas are connected to the common output pad. An interrupter voltage is applied between the common output contact area over all the interrupter circuits of the chip on a stack intermediate plane and successively all the input contact areas of the interrupter circuits of the stack intermediate plane of the chip with the exception of the input contact area which is characteristic of the stack intermediate plane and is intended to serve for addressing. A number of modules containing chips and stack intermediate planes are stacked on each other. Input contact pins are provided for the connection of the input pads of the stacked modules.

This method has the advantage that the electronic device having the stacked modules can be produced in a simple and economical manner, and the multiplicity of interrupter circuits and the multiplicity of different lines can be concentrated on just a few input contact pins via which the individual chips in the different stack intermediate planes can be addressed. Furthermore, the method has the advantage that the assignment of the chips to the individual stack the interrupter circuits.

In a further example of implementation of the production method, it is provided that, instead of the interrupter circuits, interrupter elements are disposed on the chips, which can be interrupted by laser vaporization or other vaporization beam technology. Such a method variation for producing an electronic device having stacked modules with irreversible definition and assignment of input contact pins as address contacts has the following method steps. A chip select circuit having a number of interrupter elements is disposed on each chip. The chip select circuit has separate input contact areas and a common output contact area. A separation of the interrupter elements, preferably by use of laser vaporization, insofar as they do not serve for addressing of the chip is performed. The chip is disposed on a lead frame having a stack intermediate plane with a number of separate input pads and a common output pad. The input contact areas are connected to the input pads and the output contact areas are connected to the output pad. A number of the modules containing chips and lead frames with stack intermediate planes are stacked one above the other. Input contact pins are provided for the connection of the input pads of the stacked modules.

The method has the advantage that the separation of the interrupter elements in the production method can already be performed on the undivided wafer, or can be performed after the separation on the individual chips, without the chips already being applied on lead frames. In principle, however, the separation, preferably by laser technology, can also be carried out at a later time in the production method, but not when the modules have already been stacked on top of one another, since access to the interrupter elements by a vaporization beam is no longer practicable in that case.

In a further example of implementation of the method, the connection of the input contact areas to the input pads and of the output contact areas to the output pad of the stacked modules is carried out by a bonding method. The bonding method has the advantage that even modules which have a plurality of chips on a stack intermediate plane can be accommodated on a lead frame. Furthermore, the bonding method has the advantage that it is also possible to connect hybrid circuits on a stack intermediate plane.

In a preferred example of implementation of the method, the input contact pins are disposed on the side edges of the stacked modules. Disposing the contact pins on the side edges of the electronic device has the advantage over bushing technology of higher economical efficiency, but also the disadvantage that the number of contact pins that can be accommodated is limited.

In a further example of implementation of the method, all the stack intermediate planes are now fabricated with an identical layout. The identical layout has only the input pads and the common output pad for access to the stack intermediate planes and has no individual addressing circuits or chip select circuits.

In a further example of implementation of the method, the irreversible assignment is carried out directly on a semiconductor wafer by interrupting a predetermined number of the interrupter circuits or of the interrupter elements after integrated circuits have been completed on the semiconductor wafer, but prior to the separation of the semiconductor wafer into individual semiconductor chips. This method has an economical advantage in particular when the chip select circuit is provided with interrupter elements that can be severed by subsequent vaporization, with the result that the chip select circuits can be set irreversibly by laser scanning or electron scanning.

A further example of the implementation of the method according to the invention provides for the irreversible assignment to be effected after application of the chip on a lead frame strip for semiconductor chips, by applying an interrupter voltage to a predetermined number of interrupter circuits or vaporizing a predetermined number of interrupter elements. The irreversible assignment as long as the chips are still fixed on a lead frame strip has the advantage that, directly after the bonding of the semiconductor chips and their contact areas with the contact pads of the lead frame strip, the assignment can be effected without a relatively high outlay by applying interrupter voltages, or by employing the laser beam technique to severe correspondingly prepared interrupter elements from the chips. For this purpose, the lead frame strip is produced by patterning a metal strip with flat conductor patterns.

As an alternative, the lead frame strip can be produced from a metal-coated sheet strip by patterning the metal layer of the sheet strip to form conductor tracks. In this production procedure, the irreversible assignment is effected after the carrying out of the connection preferably after bonding between the contact areas—disposed one after the other on the lead frame strip—on the chips and the pads on the lead frame strip and prior to stacking of the components to form an electronic device. For the stacking of the devices, the lead frame strip is separated into individual lead frames with chip and, in accordance with the assignment performed, the separated lead frames are stacked on top of one another in order of the assignment of the stack intermediate frames.

Address and data lines are short-circuited in particular when stacking TSOP modules, BGA packages or at the chip level. A chip of the stacking configuration is in each case activated via a chip select circuit or a chip select. The chip select is therefore wired separately toward the outside for each chip. Therefore, different layouts are also necessary in the different stacking planes in order in each case to connect the chip select. The present invention now enables a uniform layout of the stack intermediate planes or lead frames. Consequently, the definition of the chip select at the chip level reduces layout costs since a uniform layout for all the stack intermediate planes becomes possible, all the stack intermediate planes are short-circuited in a simple manner, and the output connection or PAD connection for the chip select can take place at the chip level since the definition for the chip select is provided at the chip level. The interrupter circuits may be simple line-based fuses that melt through the application of a correspondingly high interrupter voltage and thus the formation of a high current density.

Other features which are considered as characteristic for the invention are set forth in the appended claims.

Although the invention is illustrated and described herein as embodied in an electronic device having stacked modules and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
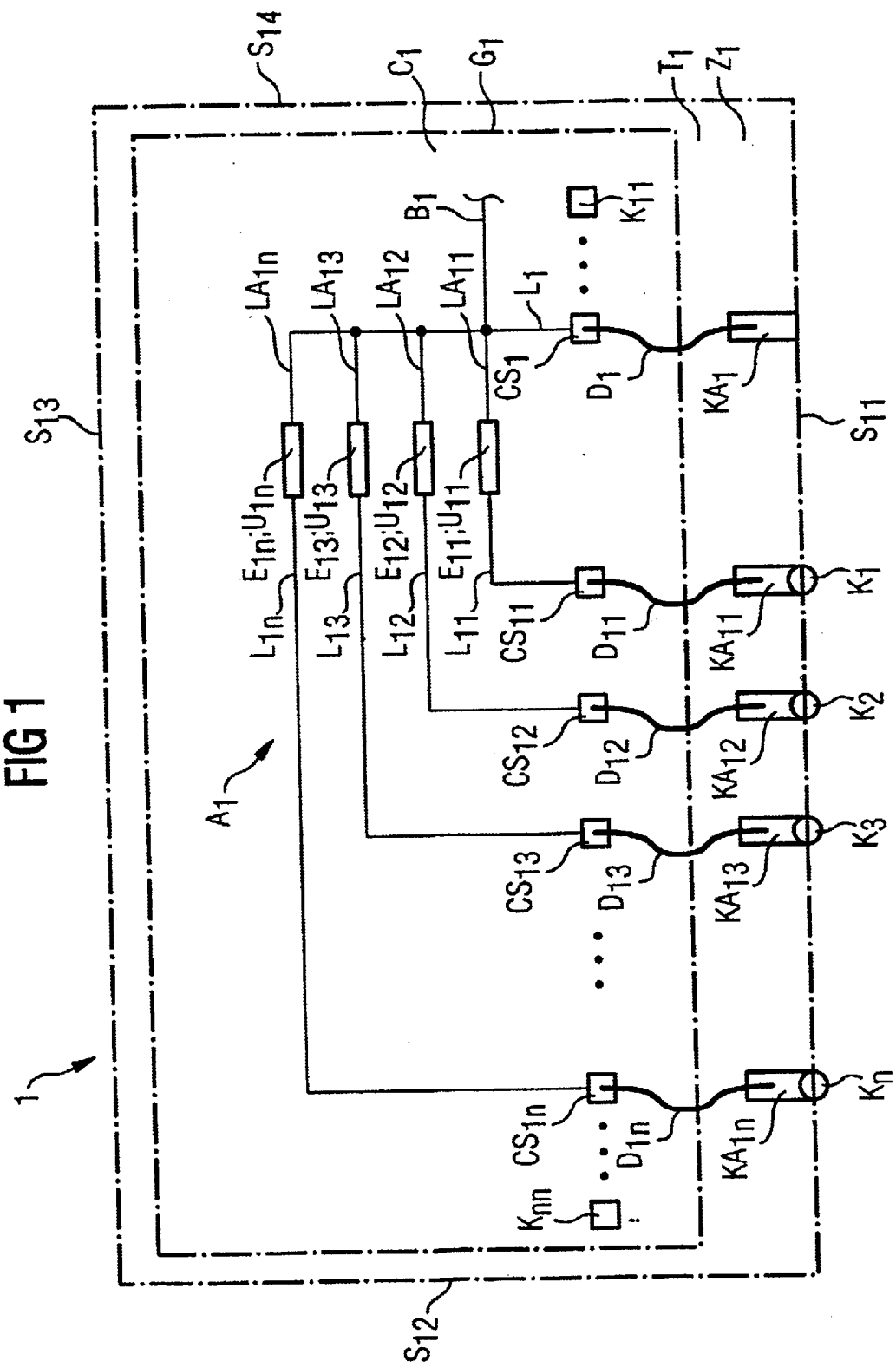
FIG. 1 is a plan view of a module containing a lead frame and a chip with a chip select circuit on the chip according to the invention.

In all the figures of the drawing, sub-features and integral parts that correspond to one another bear the same reference symbol in each case. Referring now to the figures of the drawing in detail and first, particularly, to FIG. 1 thereof, there is shown a schematic sketch in a plan view of a module 1 containing a lead frame T1 and a chip C1 with a chip select circuit A1 on the chip C1. The dashed-dotted line symbolizes a boundary G1 of the chip C1. The chip C1 is mounted on the lead frame T1 that has four side edges S11, S12, S13 and S14. Disposed on the chip C1 is the chip select circuit A1, which essentially contains interrupter circuits U11 to U1n or interrupter elements E11 to E1n, the interrupter circuits U11 to U1n or the interrupter elements E11 to E1n have input lines L11 to L1n and output lines LA11 to LA1n.

While the output lines LA11 to LA1n are connected via a common output line L1 to an output contact area CS1 on the chip C1, the input lines L11 to L1n are led separately to individual input contact areas CS11 to CS1n on the chip C1. In addition to the common output line L1, a further output line B1 is provided on the chip C1, on which further output signals, for example, an addressing signal can be forwarded, while the common output line L1 serves for programming or irreversible assignment of the chip select circuit A1.

On the lead frame T1, in the exemplary embodiment, input pads KA11 to KA1n are disposed in an edge region of the side edge S11, which input pads KA11 to KA1n are connected via bonding wires D11 to D1n to the input contact areas CS11 to CS1n on the chip C1. The input pads KA11 to KA1n make contact with input contact pins K1 to Kn disposed on the side edge S11 of the lead frame T1.

An output pad KA1 in the edge region of the side edge S11 of the lead frame T1 is connected via a bonding wire D1 to the common output contact area CS1 of the chip C1. Further contact areas K11 to K1m are disposed on the chip C1 and correspond to the integrated circuit on the chip C1.

For the irreversible assignment of the module 1 shown in FIG. 1 to a stack intermediate plane, in accordance with the number of the stack intermediate plane, which are consecutively numbered from 1 to n, one of the interrupter circuits U11 to U1n or of the interrupter elements E11 to E1n is not interrupted, while the remaining interrupter circuits or interrupter elements are interrupted by impressing an interrupter voltage or by a vaporization treatment and by a laser beam or electron beam. As a result, one of the input contact pins K1 to Kn is unambiguously assigned to the address line B1. In the embodiment according to FIG. 1, the chip select circuit A1 is thus disposed on the chip C1 itself, and not on the stack intermediate plane Z1 or on the lead frame T1, with the result that all the stack intermediate planes Z1 to Zn of the modules 1–n of the electronic device can be constructed completely identically. While the input pads KA11 to KA1n on the lead frame T1 are connected to input contact pins K1 to Kn, the common output pad KA1 of the modules is not connected to one another by a contact pin, rather the output pad KA1 serves merely for the programming of the chip select circuits A1 to An on the chips C1 to Cn.

Figure 2:
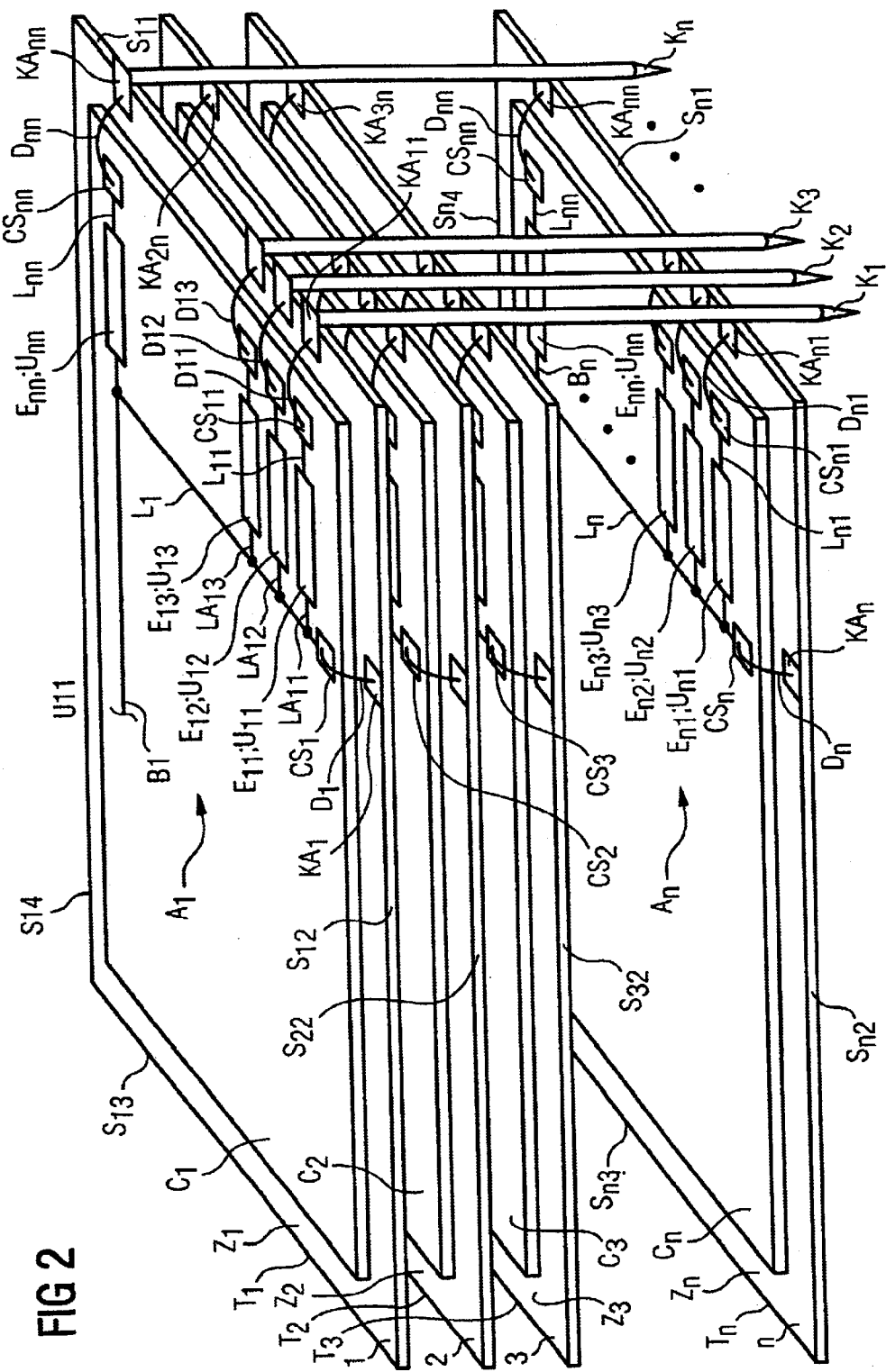
FIG. 2 is a perspective view of an electronic device containing n stacked modules with n chip select circuits on the chips.

FIG. 2 shows a schematic sketch in a perspective view of the electronic device containing n stacked modules 1 to n with n chip select circuits A1 to An on the chips C1 to Cn. The modules 1–n are disposed such that they are stacked one above the other. The topmost module 1 shown in FIG. 2 corresponds to the module shown in FIG. 1. Identical reference symbols identify identical constructional elements and, therefore, are not explained again. The modules 1–n each have the lead frame T1 to Tn with the stack intermediate plane Z1 to Zn. A chip C1 to Cn is disposed on each lead frame T1 to Tn. Each chip C1 to Cn has a chip select circuit A1 to An in addition to an integrated circuit. The chip select circuits A1 to An essentially contain interrupter circuits U11 to Unn or interrupter elements E11 to Enn. Separate input lines L11 to Lnn connect the interrupter circuits or the interrupter elements to input contact areas CS11 to CSnn on the chips C1 to Cn. In this exemplary embodiment, the chips C1 to Cn are semiconductor chips having at least one integrated circuit. The integrated circuit is addressed via the common output line B1 to Bn of the respective chip select circuits A1 to An. After the above-discussed assignments of the chip select circuits A1 to An of the modules 1–n, there is a direct connection between the individual input contact pins K1 to Kn and the output lines B1 to Bn, with the result that the integrated circuits on the stack intermediate planes can be addressed via the input contact pins K1 to Kn.

The electronic component represented in FIG. 2 and containing the stacked modules 1-n, which may be TSOP modules, for example, was produced by the following methods in this embodiment. First, during the introduction of the integrated circuit, onto the chips C1 to Cn, the chip select circuit with a number of interrupter circuits U11 to U1n was also applied at the same time, the interrupter circuits having the separate input contact areas CS11 to CS1n and a common output contact area CS1.

The chips C1 to Cn configured in this way are applied on a lead frame strip with the lead frames T1 to Tn disposed one after the other, in which case the lead frame strip may be a patterned metal strip with flat conductor patterns or may contain a sheet strip with a metal coating. In the case of the sheet strip, the metal layer of the metal coating is patterned to form conductor tracks and, in addition, output pads and input pads are provided on the lead frame strip. While the chips C1 to Cn are still disposed one after the other on the lead frame strip, they can be provided with bonding wires, the bonding wires, for the chip select circuits A1 to An, connecting both the separate input contact areas and the common output contact area of each chip select circuit A1 to An to the corresponding input pads and output pads provided on the lead frame strip.

For the irreversible assignment of the modules 1 to n to a position in the stack and for the unambiguous addressing of the individual integrated circuit in the stack, the assignment can be performed while still on the lead frame strip, by corresponding interrupter voltages being applied to the input pads KA11 to KAnn or the output pads KA1 to KAn. In this case, a respective one of the interrupter circuits U11 to Unn that is characteristic of the module 1 to n does not have an interrupter voltage applied to it.

Once the modules have been irreversibly assigned in this way with the aid of the chip select circuits A1 to An, the lead frame strip is separated into individual lead frames and the latter, with the chips C1 to Cn situated thereon, are stacked one above the other in the envisaged order and, as shown in FIG. 2, are provided with the input contact pins K1 to Kn on one of the side edges S11 to S1n, which input contact pins connect together the input pads lying one above the other. On account of the irreversible assignment carried out previously with the aid of the chip select circuits A1 to An, the input contact pins K1 to Kn are thus in each case unambiguously connected to one of the address lines B1 to Bn on the chips C1 to Cn. The line structure of the lead frames T1 to Tn is identical for all the stack intermediate planes Z1 to Zn, with the result that a single layout is required for all the stack intermediate planes.

We claim:

1. An electronic device, comprising:
   stacked modules having a number of stack intermediate planes and chips mounted on said stack intermediate planes, said stack intermediate planes of said stacked modules each having an identical layout;
   contact areas disposed on said chips; and
   chip select circuits disposed on said chips and to be set irreversibly through said contact areas, said chip select circuits enable an irreversible assignment of said contact areas to said stack intermediate planes, each of said chip select circuits having a number of interrupter circuits disposed on one of said chips, said number of said interrupter circuits on each of said chips corresponding at least to said number of said stack intermediate planes.

2. The electronic device according to claim 1,
   wherein said contact areas include input contact areas and output contact areas;
   including input lines and output lines; and
   wherein each of said interrupter circuits is connected to one of said input contact areas through one of said input lines and to one of said output contact areas through one of said output lines.

3. The electronic device according to claim 2, wherein said interrupter circuits on each of said chips are connected to a common one of said output contact areas and to separate ones of said input contact areas.

4. The electronic device, comprising:
   stacked modules having a number of stack intermediate planes and chips mounted on said stack intermediate planes, said stack intermediate planes of said stacked modules each having an identical layout;
   contact areas disposed on said chips, said contact areas having input contact areas and output contact areas;
   input lines and output lines;
   chip select circuits disposed on said chips and to be set irreversibly through said contact areas, said chip select circuits enabling an irreversible assignment of said contact areas to said stack intermediate planes, each of said chip select circuits having a number of intertupter circuits disposed on one of said chips, said number of said interrupter circuits on each of said chips corresponding at least to said number of said stack intermediate planes;
   said interrupter circuits on each of said chips being connected to a common one of said output contact areas and to separate ones of said input contact areas;
   each of said interrupter circuits being connected to one of said input contact areas through one of said input lines and to one of said output contact areas through one of said output lines;
   input pads disposed on said stack intermediate planes; and
   bonding wires connected between said input pads and said input contact areas.

5. The electronic device according to claim 4, including input contact pins connected to said input pads for connecting said stacked modules.

6. The electronic device according to claim 4, including input contact pins connected to said input pads disposed on said stack intermediate planes, said input contact pins extending down to a base area of the electronic device.

7. The electronic device according to claim 4, wherein said input pads are disposed at an edge region of each of said stack intermediate planes and are connected to said input contact pins disposed on side areas of said stack intermediate planes.

8. An electronic device, comprising:
   stacked modules having a number of stack intermediate planes and chips mounted on said stack intermediate planes, said stack intermediate planes of said stacked modules each having an identical layout;
   contact areas disposed on said chips, said contact areas having input contact areas and output contact areas;
   input lines and output lines;
   chip select circuits disposed on said chips and to be set irreversibly through said contact areas, said chip select circuits enabling an irreversible assignment of said contact areas to said stack intermediate planes, each of said chip select circuits having a number of intertupter circuits disposed on one of said chips, said number of said interrupter circuits on each of said chips corresponding at least to said number of said stack intermediate planes;

said interrupter circuits on each of said chips being connected to a common one of said output contact areas and to separate ones of said input contact areas;

each of said interrupter circuits being connected to one of said input contact areas through one of said input lines and to one of said output contact areas through one of said output lines;

common output pads disposed on said stack intermediate planes; and bonded wires, one of said bonded wires connected between one of said common output pads and to said common one of said output contact areas.

9. A method for producing an electronic device having stacked modules with irreversible definition and assignment of input contact pins as address contacts, which comprises the steps of:

a) forming a module by applying a chip select circuit having a number of interrupter circuits to a chip, the chip select circuit having separate input contact areas and a common output contact area;

b) applying the chip to a lead frame having a stack intermediate plane with a number of separate input pads and an output pad disposed on the stack intermediate plane;

c) connecting the input contact areas to the input pads and connecting the common output contact area to the output pad;

d) applying an interrupter voltage between the output pad for all of the interrupter circuits of the chip on the stack intermediate plane and successively all the input contact areas of the interrupter circuits of the stack intermediate plane of the chip with an exception of one of the input contact areas which is characteristic of the stack intermediate plane and is intended to serve for addressing;

e) repeating steps a)–d) for producing a plurality of modules;

f) stacking a number of the modules resulting in the stacked module; and g) connecting the input contact pins to the input pads and connecting an output contact pin to the output pads of the stacked modules.

10. The method according to claim 9, which comprises performing a bonding method for connecting the input contact areas to the input pads and for connecting the common output contact area to the output pad.

11. The method according to claim 9, which comprises disposing the input contact pins on side edges of the stacked modules.

12. The method according to claim 9, which comprises forming all of the stack intermediate planes to be identical.

13. The method according to claim 9, which comprises carrying out an application of the interrupter voltage directly on a semiconductor wafer carrying the module by interrupting a predetermined number of the interrupter circuits after integrated circuits have been completed on the semiconductor wafer.

14. The method according to claim 9, which comprises effecting the irreversible definition and assignment after application of the chip on a lead frame strip containing the lead frame, by applying the interrupter voltage to a predetermined number of the interrupter circuits.

15. The method according to claim 14, which comprises producing the lead frame strip by patterning a metal strip with flat conductor patterns.

16. The method according to claim 15, which comprises producing the irreversible definition and assignment after carrying out of the connection between the input contact areas and the input pads and the connection of the common output contact area to the output pad on the lead frame strip and prior to the stacking of the modules to form the electronic device.

17. The method according to claim 14, which comprises producing the lead frame strip from a metal-coated sheet strip by patterning a metal layer of a sheet strip to form conductor tracks.

18. A method for producing an electronic device having stacked modules with irreversible definition and assignment of input contact pins as address contacts, which comprises the following steps:

a) forming a module by applying a chip select circuit having a number of interrupter elements on a chip, the chip select circuit having separate input contact areas and a common output contact area;

b) severing the interrupter elements which do not serve for addressing of the chip;

c) applying the chip to a lead frame having a stack intermediate plane with a number of separate input pads and an output pad disposed on the stack intermediate plane;

d) connecting the input contact areas to the input pads and connecting the common output contact area to the output pad;

e) repeating steps a)–d) for forming a plurality of modules;

f) stacking a number of the modules for forming the stacked modules; and g) connecting the input contact pins to the input pads of the stacked modules.

19. The method according to claim 18, which comprises performing a bonding method for connecting the input contact areas to the input pads and for connecting the common output contact area to the output pad.

20. The method according to claim 18, which comprises performing the step of severing the interrupter elements using laser vaporization.

21. The method according to claim 18, which comprises disposing the input contact pins on side edges of the stacked modules.

22. The method according to claim 18, which comprises forming all of the stack intermediate planes to be identical.

23. The method according to claim 18, which comprises carrying out the irreversible definition and assignment directly on a semiconductor wafer carrying the module by interrupting a predetermined number of the interrupter elements after integrated circuits have been completed on the semiconductor wafer.

24. The method according to claim 18, which comprises effecting the irreversible definition and assignment after application of the chip on a lead frame strip having the lead frame, by vaporizing a predetermined number of the interrupter elements.

25. The method according to claim 24, which comprises producing the lead frame strip by patterning a metal strip with flat conductor patterns.

26. The method according to claim 24, which comprises producing the lead frame strip from a metal-coated sheet strip by patterning a metal layer of a sheet strip to form conductor tracks.

27. The method according to claim 24, which comprises producing the irreversible definition and assignment after carrying out of the connection between the input contact areas and the input pads and the connection of the common output contact area to the output pad and prior to the stacking of the modules to form the electronic device.

* * * * *

UNITED STATES PATENT AND TRADEMARK OFFICE
CERTIFICATE OF CORRECTION

PATENT NO. : 6,703,651 B2
DATED : March 9, 2004
INVENTOR(S) : Andreas Wörz et al.

It is certified that error appears in the above-identified patent and that said Letters Patent is hereby corrected as shown below:

Column 3,
Lines 43-45, should read as follows:
-- Furthermore, the method has the advantage that the assignment of the chips to the individual stack intermediate planes can be carried out by simple tripping of the interrupter circuits. --

Column 7,
Line 61, claim 1 should read as follows:
-- circuits enabling irreversible assignment of said con- --

Column 9,
Line 15, claim 8 should read as follows:
-- between one of said common output pads and said --

Signed and Sealed this

Twenty-eighth Day of December, 2004

JON W. DUDAS
*Director of the United States Patent and Trademark Office*